United States Patent
Kim et al.

(10) Patent No.: US 9,378,807 B2
(45) Date of Patent: Jun. 28, 2016

(54) NON-VOLATILE STATIC RANDOM ACCESS MEMORY CIRCUITS

(71) Applicant: Winbond Electronics Corp., Taichung (TW)

(72) Inventors: Young Tae Kim, San Ramon, CA (US); Ming-Huei Shieh, Cupertino, CA (US)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/447,004

(22) Filed: Jul. 30, 2014

(65) Prior Publication Data
US 2016/0035413 A1 Feb. 4, 2016

(51) Int. Cl.
*G11C 11/419* (2006.01)
*G11C 5/06* (2006.01)
*G11C 5/14* (2006.01)

(52) U.S. Cl.
CPC ............... *G11C 11/419* (2013.01); *G11C 5/06* (2013.01); *G11C 5/148* (2013.01)

(58) Field of Classification Search
CPC .......................... G11C 11/417; G11C 13/0009
USPC ................................................. 365/154, 148
See application file for complete search history.

(56) References Cited

U.S. PATENT DOCUMENTS

| 6,862,226 B2 | 3/2005 | Toyoda et al. |
| 6,944,050 B2 * | 9/2005 | Kang .................... G11C 11/412 365/154 |
| 7,760,538 B1 | 7/2010 | Paak |
| 8,194,438 B2 | 6/2012 | Ahn et al. |
| 8,243,498 B2 * | 8/2012 | Abe ........................ G11C 11/15 365/148 |
| 8,331,134 B2 | 12/2012 | Chiu et al. |
| 2013/0028011 A1 * | 1/2013 | Kitagawa ........... G11C 19/0808 365/158 |

FOREIGN PATENT DOCUMENTS

TW 200411672 A 7/2004

* cited by examiner

*Primary Examiner* — Hoai V Ho
*Assistant Examiner* — Tri Hoang
(74) *Attorney, Agent, or Firm* — Muncy, Geissler, Olds & Lowe, P.C.

(57) ABSTRACT

A non-volatile static random access memory (nvSRAM) circuit is provided. The nvSRAM circuit includes first and second switches and a latch circuit. The first switch has a first terminal coupled to a first bit line. The second switch has a first terminal coupled to a second bit line. The latch circuit is coupled to second terminals of the first and second switches. The latch circuit has a first non-volatile memory element. When the nvSRAM circuit is at a writing mode, first input data on the first bit line is written into in the latch circuit, and the first non-volatile memory element has a first state corresponding to the first data. When the nvSRAM circuit is at a reading mode, first readout data is generated according to the first state of the first non-volatile memory element is generated and provided to the first bit line.

20 Claims, 13 Drawing Sheets

NON-VOLATILE STATIC RANDOM ACCESS MEMORY CIRCUITS

BACKGROUND OF THE INVENTION

1. Field of the Invention

The invention relates to a non-volatile static random access memory circuit, and more particularly to a non-volatile static random access memory circuit without a storage mode and a recall mode.

2. Description of the Related Art

Semiconductor memory devices are widely used in computers and other electronics products to store digital information. A typical semiconductor memory device has a large number of memory elements, known as memory cells, that are each capable of storing a single digital bit or data bit. Among several types of semiconductor memory devices, a non-volatile state random access memory device has high accessing speed. Moreover, when the power supply of the non-volatile state random access memory device is off, the previously stored data does not lost. Accordingly, in the power-off state or the standby mode, the power supply of the non-volatile state random access memory device can be cut off completely without concerning the data storage issue, thereby reducing power consumption.

Generally, before a conventional non-volatile state random access memory device enters the power-off state or the standby mode, the non-volatile state random access memory device has to operate in a storage mode to store data in a non-volatile memory element from a latch. After the power supply of the non-volatile state random access memory device is on, the non-volatile state random access memory device has to operate in a recall mode to recall the data from the on-volatile memory element to the latch. However, storage mode and the recall mode cause extra timing.

BRIEF SUMMARY OF THE INVENTION

It is desirable to provide a non-volatile static random access memory circuit which required no storage mode and no recall mode when a power-off state or a standby mode occurs.

An exemplary embodiment of a non-volatile static random access memory circuit is provided. The non-volatile static random access memory circuit comprises a first switch, a second switch, and a latch circuit. The first switch has a first terminal coupled to a first bit line and further having a second terminal. The second switch has a first terminal coupled to a second bit line and further having a second terminal. The latch circuit is coupled to the second terminal of the first switch and the second terminal of the second switch. The latch circuit has a first non-volatile memory element. When the non-volatile, static random access memory circuit is at a writing mode, first input data on the first bit line is written into the latch circuit, and the first non-volatile memory element has a first state corresponding to the first data. When the non-volatile static random access memory is at a reading mode, first readout data is generated according to the first state of the first non-volatile memory element is generated and provided to the first bit line.

The first switch and the second switch are turned on. At the reading mode, the first switch and the second switch are turned on. In another embodiment, between the writing mode and the reading mode, no supply voltage powers the non-volatile static random access memory circuit or the non-volatile static random access memory circuit is at a standby mode.

The non-volatile static random access memory circuit further comprises a writing control circuit. The writing control circuit is coupled to the latch circuit and receiving a writing selection signal to control the latch circuit. At the writing mode, the selection signal is at a first voltage level to control the latch circuit to change the first non-volatile memory element to be in the first state. At the reading mode, the writing selection signal is at a second voltage level to control the latch circuit to generate the first readout signal according to the first state.

In one embodiment, the latch circuit comprises a first first-type transistor, a first second-type transistor, a second second-type transistor, a second first-type transistor, a third second-type transistor, a fourth second-type transistor. The first first-type transistor has a control terminal coupled to a first node, an input terminal, and an output terminal coupled to a second node. A first second-type transistor has a control terminal coupled to a third node, an input terminal coupled to the second node, and an output terminal coupled to a ground. The second second-type transistor has a control terminal, an input terminal coupled to the first node, and an output terminal coupled to the second node. The second first-type transistor has a control terminal coupled to the first node, an input terminal, and an output terminal coupled to the third node. The third second-type transistor has a control terminal coupled to the second node, an input terminal coupled to the third node, and an output terminal coupled to the ground. The fourth second-type transistor has a control terminal, an input terminal coupled to a fourth node, and an output terminal coupled to the third node. The first non-volatile memory element is coupled between the second node and the fourth node. The second terminal of the first switch is coupled to the third node, and the second terminal of the second switch is coupled to the second node. At the writing mode, the second second-type transistor and the fourth second-type transistor are turned on. At the reading mode, the second second-type transistor and the fourth second-type transistor are turned off, and the input terminal of the first first-type transistor and the input terminal of the second first-type transistor receive a supply voltage of the non-volatile static random access memory circuit.

The non-volatile static random access memory circuit further comprises a third first-type transistor. The third first-type transistor has a control terminal, an input terminal coupled to a voltage source of the non-volatile static random access memory circuit, and an output terminal coupled to the input terminal of the first first-type transistor and the input terminal of the second first-type transistor. The control terminal of the second second-type transistor and the control terminal of the fourth second-type transistor receive the writing selection signal. At the writing mode, the third first-type transistor is turned off, and the writing selection signal is at a first voltage level to turn on the second second-type transistor and the fourth second-type transistor. At the reading mode, the third first-type transistor is turned on, and the writing selection signal is at a second voltage level to turn off the second second-type transistor and the fourth second-type transistor.

In an embodiment, the control terminal of the third first-type transistor receives the writing selection signal. At the writing mode, the writing selection signal is at the first voltage level to turn off the third first-type transistor. At the reading mode, the writing selection signal is at the second voltage level to turn on the third first-type transistor.

In another embodiment, the control terminal of the third first-type transistor receives a power gating signal. At the writing mode, the power gating signal is at a third voltage level to turn off the third first-type transistor. At the reading mode, the power gating signal is at a fourth voltage level to turn on the third first-type transistor. When the non-volatile static random access memory circuit is at a standby mode, the power gating signal is at a fourth voltage level to turn off the third first-type transistor.

In another embodiment, the latch circuit comprises a first first-type transistor, a first second-type transistor, a second second-type transistor, a second first-type transistor, a third second-type transistor, and a fourth second-type transistor. The first first-type transistor has a control terminal coupled to a first node, an input terminal, and an output coupled to a second node. The first second-type transistor has a control terminal coupled to the first node, an input terminal coupled to a third node, and an output terminal coupled to a ground. The second second-type transistor has a control terminal, an input terminal coupled to the second node, and an output terminal coupled to the first node. The second first-type transistor has a control terminal coupled to the first node, an input terminal, and an output terminal coupled to a fourth node. The third second-type transistor has a control terminal coupled to the third node, an input terminal coupled to the first node, and an output terminal coupled to the ground. The fourth second-type transistor has a control terminal, an input terminal coupled to the fourth node, and an output terminal coupled to the third node. The first non-volatile memory element is coupled between the first node and the fourth node. The second terminal of the first switch is coupled to the first node, and the second terminal of the second switch is coupled to the third node. At the writing mode, the second second-type transistor and the fourth second-type transistor are turned on. At the reading mode, the second second-type transistor and the fourth second-type transistor are turned off, and the input terminal of the first first-type transistor and the input terminal of the second first-type transistor receive a supply voltage of the non-volatile static random access memory circuit.

The non-volatile static random access memory circuit further comprises a third first-type transistor. The third first-type transistor has a control terminal, an input terminal coupled to a voltage source of the non-volatile static random access memory circuit, and an output terminal coupled to the input terminal of the first first-type transistor and the input terminal of the second first-type transistor. The control terminal of the second second-type transistor and the control terminal of the fourth second-type transistor receive the writing selection signal. At the writing mode, the third first-type transistor is turned off, and the writing selection signal is at a first voltage level (VDD) to turn on the second second-type and the fourth second-type transistor. At the reading mode, the third first-type transistor is turned on, and the writing selection signal is at a second voltage level to turn off the second second-type transistor and the fourth second-type transistor.

In an embodiment, the control terminal of the third first-type transistor receives the writing selection signal. At the writing mode, the writing selection signal is at the first voltage level to turn off the third first-type transistor. At the reading mode, the writing selection signal is at a second voltage level to turn on the third first-type transistor.

In another embodiment, the control terminal of the third first-type transistor receives a power gating signal. At the writing mode, the power gating signal is at a third voltage level to turn off the third first-type transistor. At the reading mode, the power gating signal is at a fourth voltage level to turn on the third first-type transistor. The non-volatile static random access memory circuit is at a standby mode, the power gating signal is at a third voltage level to turn off the third first-type transistor.

In further an embodiment, the latch circuit further has a second non-volatile memory element. When the non-volatile static random access memory circuit is at the writing mode, second input data on the second bit line, is written into in the latch circuit, and the second non-volatile memory element has a second state corresponding to the second data. The non-volatile static random access memory is at the reading mode, second readout data is generated according to the second state of the second non-volatile memory element is generated and provided to the second bit line.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
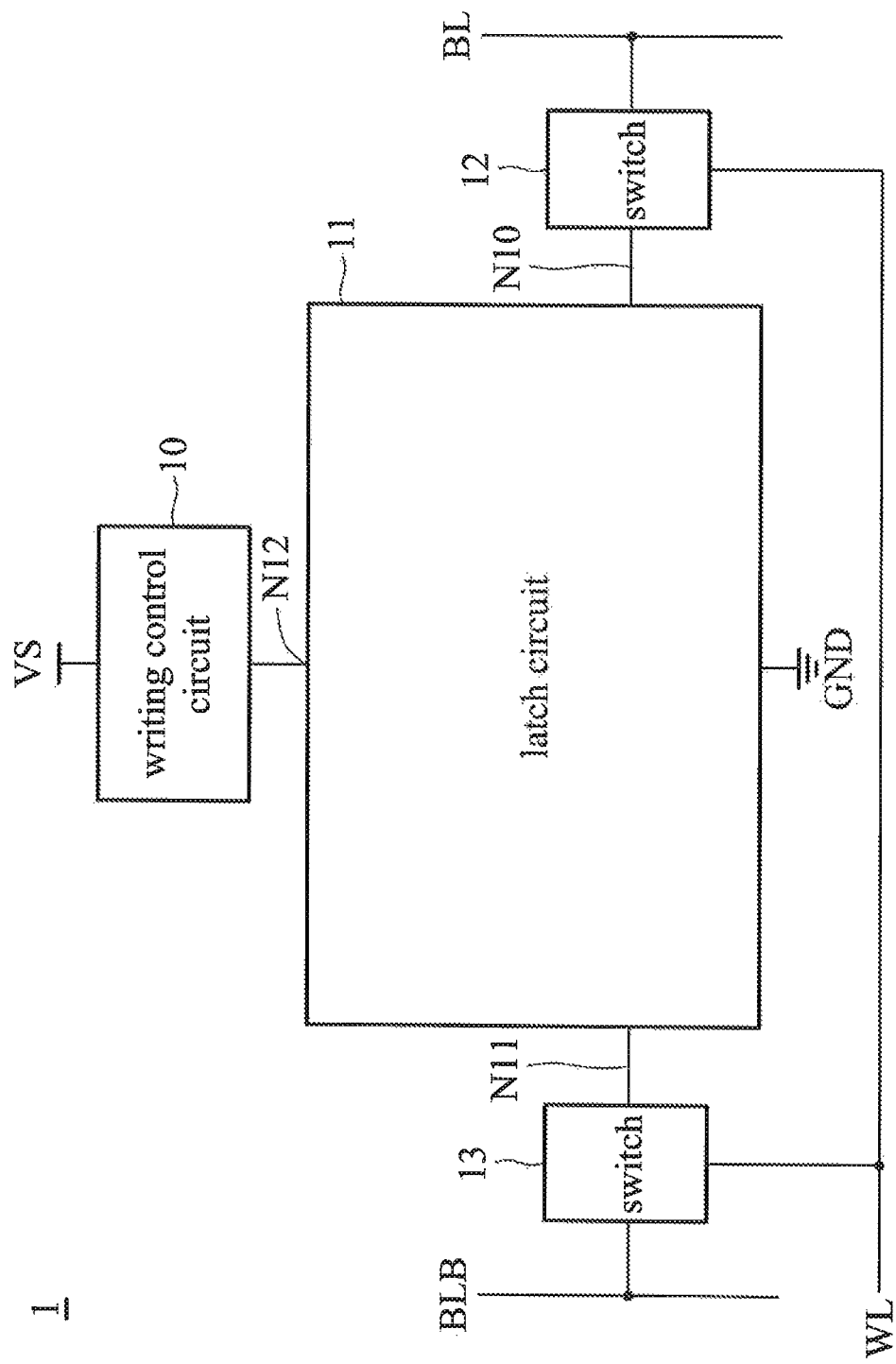
FIG. 1 shows an exemplary embodiment of a non-volatile static random access memory circuit.

Non-volatile static random access memory circuits are provided. In an exemplary embodiment of a non-volatile static random access memory circuit in FIG. 1, a non-volatile static random access memory circuit 1 comprises a writing control circuit 10, a latch circuit 11, switches 12 and 13. As shown in FIG. 1, one terminal of the switch 12 is coupled to a bit line BL, and the other terminal thereof is coupled to the latch circuit 11 at a node N10. One terminal of the switch 13 is coupled to a bit line BLB, and the other terminal thereof is coupled to the latch circuit 11 at a node N11. Control terminals of the switches 12 and 13 are both coupled to a word line WL. The writing control circuit 10 is coupled to the latch circuit 11 for controlling operations when the non-volatile static random access memory circuit 1 operates at a writing mode or a reading mode. Through the controlling of the writing control circuit 10, the data from the bit line BL and BLBs is continuously stored in the latch circuit 11. Thus, before the non-volatile state random access memory device 1 enters the power-off state or the standby mode, the non-volatile state random access memory device 1 is not required to operate in a conventional storage mode. Moreover, after the power supply of the non-volatile state random access memory device 1 is on, the non-volatile state random access memory device 1 is not required to operate in a conventional recall mode. The detailed circuit structure and operation of the non-volatile state random access memory device 1 will be described in the following.

Figure 2:
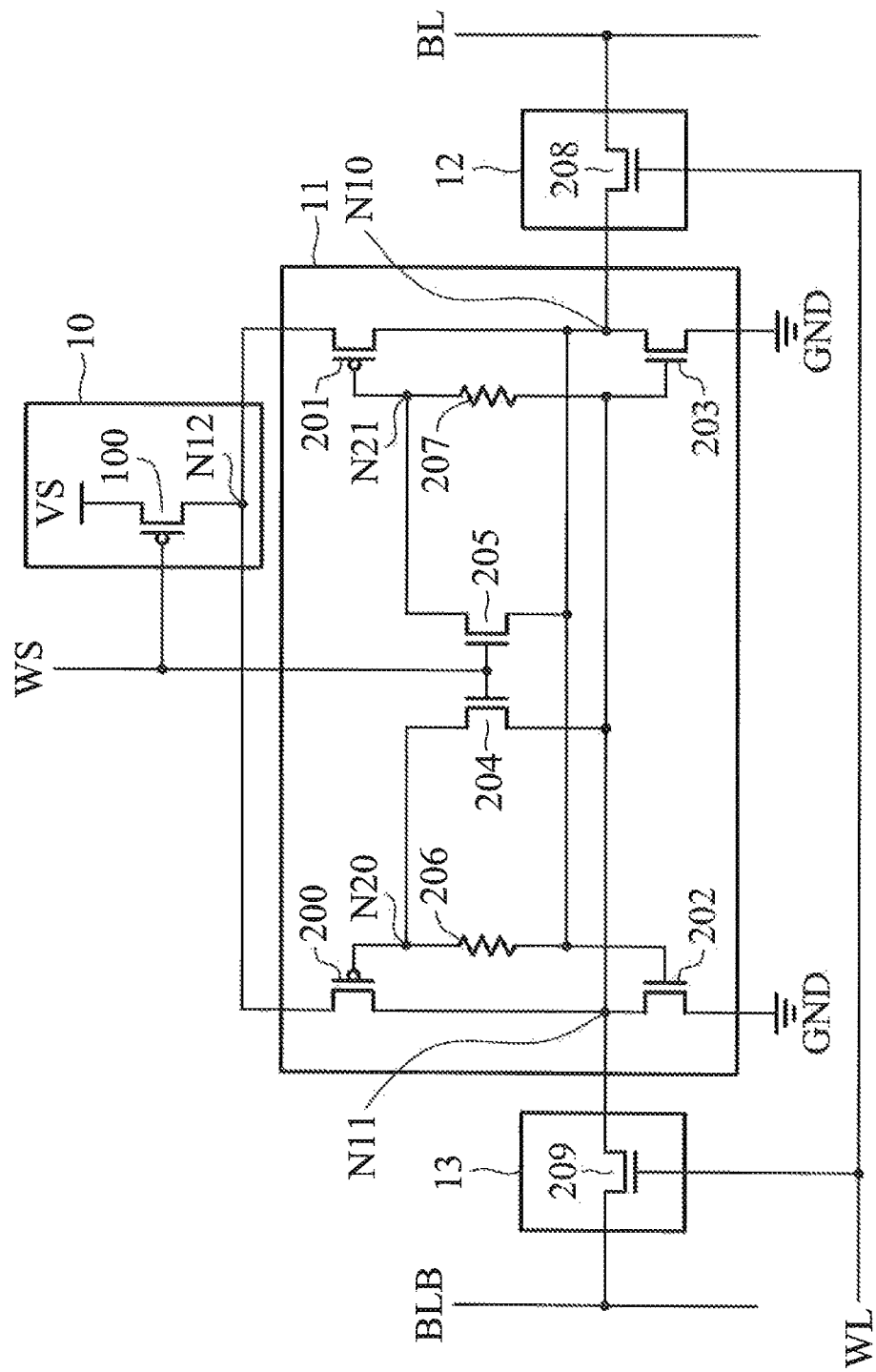
FIG. 2 shows another exemplary embodiment of a non-volatile static random access memory circuit.

In an embodiment, referring to FIG. 2, the writing control circuit 10 comprises P-type metal oxide semiconductor (PMOS) transistor 100. A control terminal (gate) of the PMOS transistor 100 receives a writing selection signal WS, an input terminal (source) thereof is coupled to a voltage source VS of the non-volatile state random access memory device 1, and an output terminal (drain) there is coupled to the latch circuit 11 at a node N12. The latch circuit 11 comprises PMOS transistors 200 and 201, N-type metal oxide semiconductor (NMOS) transistors 202-205, and non-volatile memory elements 206 and 207. In the embodiment, the switches 12 and 13 are implemented by NMOS transistors 208 and 209. A control terminal of the PMOS transistor 200 is coupled to a node N20, an input terminal thereof is coupled to the node N12, and an output terminal thereof is coupled to the node N11. A control terminal (gate) of the NMOS transistor 202 is coupled to the node N10, an input terminal (drain) thereof is coupled the node N11, and an output terminal thereof is coupled to a ground GND. A control terminal of the NMOS transistor 204 receives the writing selection signal WS, an input terminal thereof is coupled to the node N20, and an output terminal thereof is coupled to the node N11. The non-volatile memory element 206 is coupled between the node N20 and the node N10.

A control terminal of the PMOS transistor 201 is coupled to a node N21, an input terminal thereof is coupled to the node N12, and an output terminal thereof is coupled to the node N10. A control terminal of the NMOS transistor 203 is coupled to the node N11, an input terminal thereof is coupled the node N10, and an output terminal thereof is coupled to the ground GND. A control terminal of the NMOS transistor 205 receives the writing selection signal WS, an input terminal thereof is coupled to the node N21, and an output terminal thereof is coupled to the node N10. The non-volatile memory element 207 is coupled between the node N21 and the node N11.

Figure 3A:
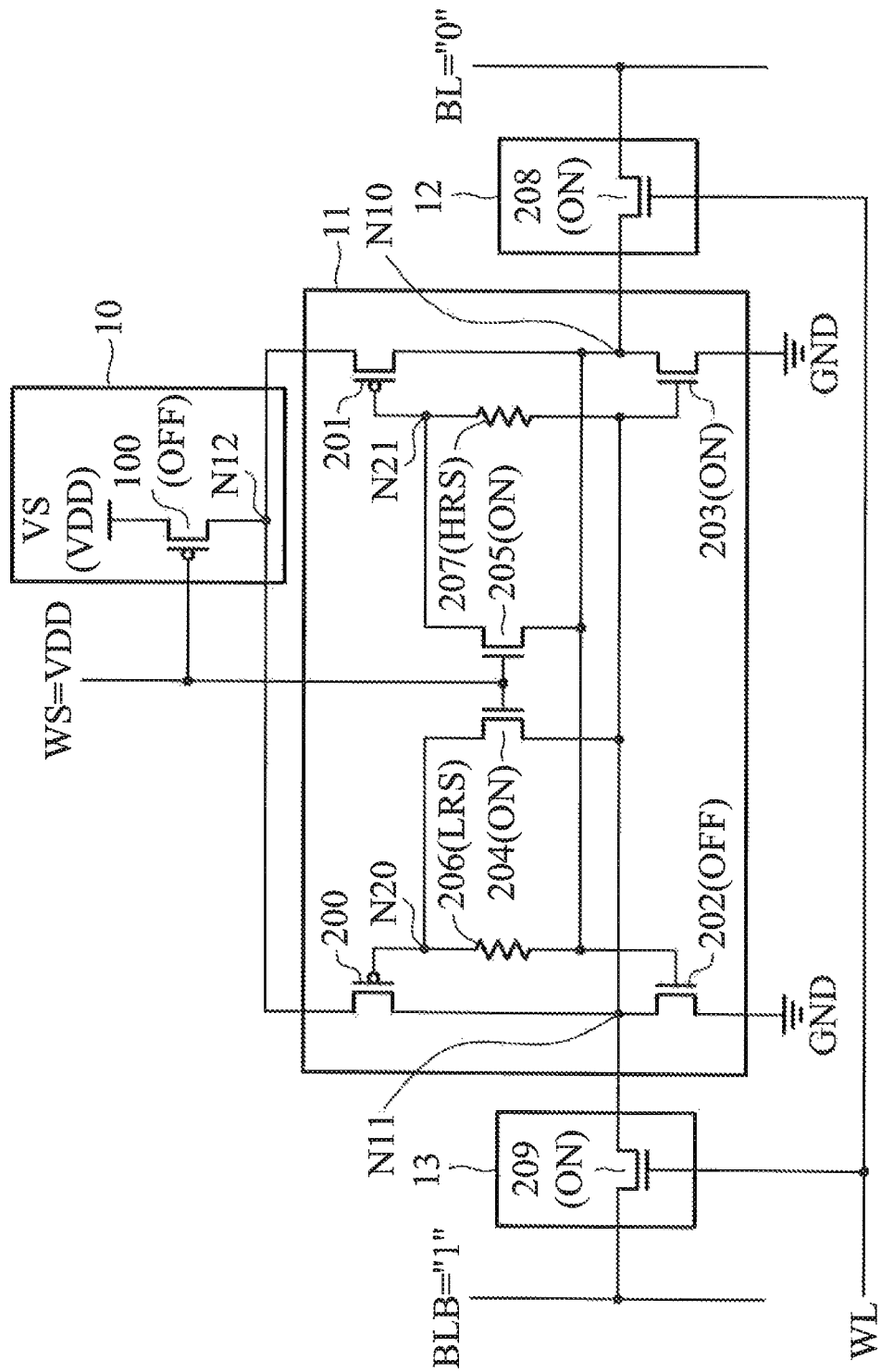
FIG. 3A shows an embodiment of the operation of the non-volatile state random access memory device in FIG. 2 at a writing mode.

As shown in FIG. 3A, when a supply voltage VDD powers the non-volatile state random access memory device 1 through the voltage source VS and the non-volatile state random access memory device 1 operates at the writing mode, the writing selection signal WS is at a high level of the supply voltage VDD (SW=VDD), and the word line WL has a high level. Assume that data of logic "0" is on the bit line BL (BL=0) while data of logic "1" is on the bit line BLB (BLB=1). Due to the writing selection signal WS with the high level, the PMOS transistor 100 is turned off (OFF) while the NMOS transistors 204 and 205 are turned on (ON). Due to the high level of the word line WL, the NMOS transistors 208 and 209 are turned on. At this time, in response to the data of logic "0" on the hit line BL, the node N10 has a low level to turn off the NMOS transistor 202. Due to the low level of the node N10 and the turned-on state of the NMOS transistor 205, the node N21 has a low level. Moreover, in response to the data of logic "1" on the bit BLB, the node N11 has a high level to turn on the NMOS transistor 203. Due to the high level of the node N11 and the turned-on state of the NMOS transistor 204, the node N20 has a high level.

As described above, the non-volatile memory element 206 is coupled between the node N20 and the node N10, and the non-volatile memory element 207 is coupled between the node N21 and the node N11. Since the node N20 has the high level and the node N10 has the low level, there is forward bias applied to the non-volatile memory element 206, and the non-volatile memory element 206 has a low resistance state (LRS) to record the data of logic "0" no the bit line BL. On the contrary, since the node N21 has the low level and the node N11 has the high level. There is reverse bias applied to the non-volatile memory element 207, and the non-volatile memory element 207 has a high resistance state (HRS) to record the data of logic "1" on the bit line BLB.

According to the embodiment, the data on the bit lines BL and BLB are recorded in the latch circuit 11 by the form of the resistance states of the non-volatile memory elements 206 and 207. Thus, before the non-volatile state random access memory 1 enters the power-off state or the standby mode (that is the supply voltage VDD is not provided), a conventional storage mode is not required any more, thereby saving timing of the non-volatile state random access memory device 1.

Figure 3B:
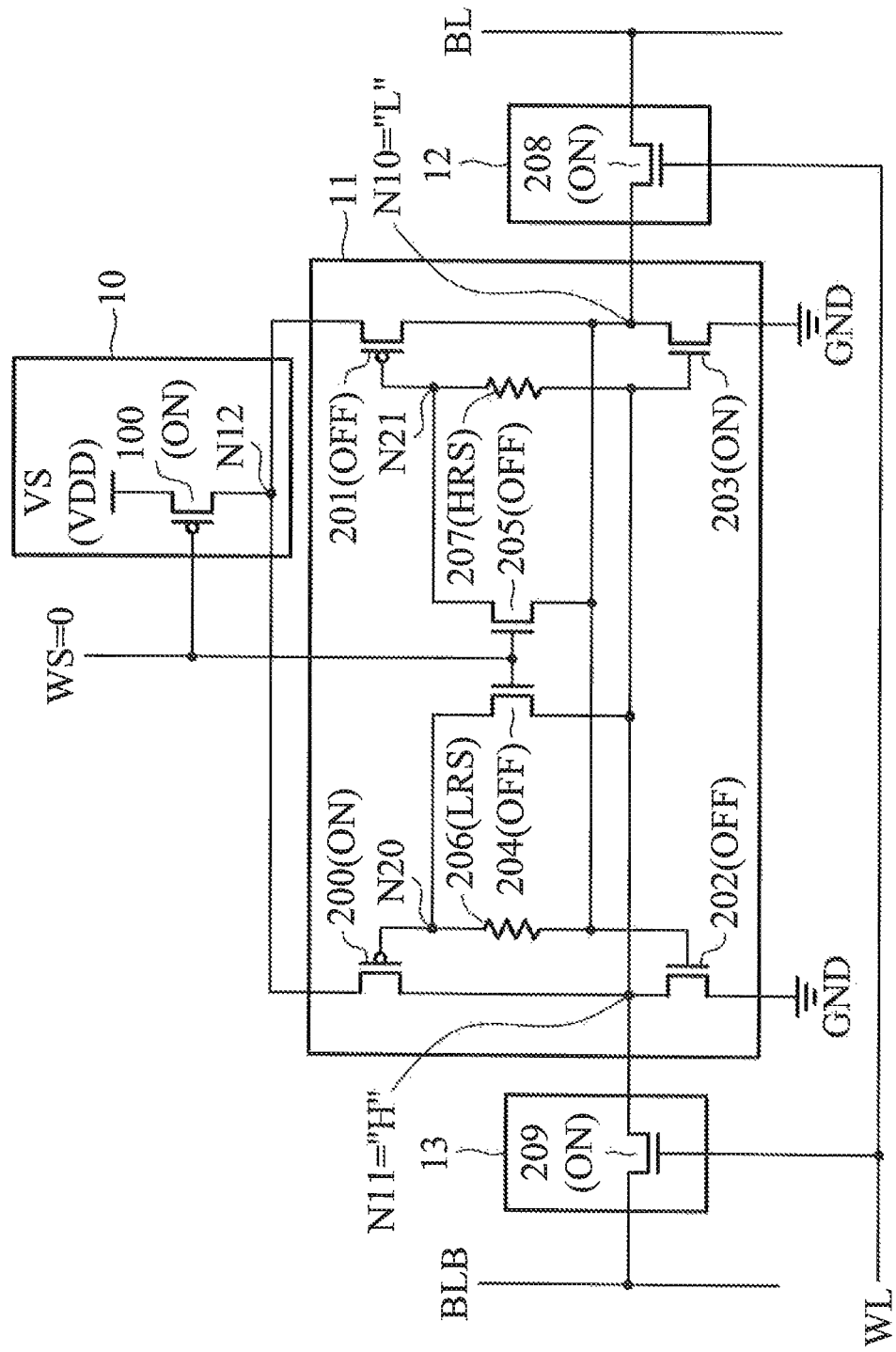
FIG. 3B shows an embodiment of the operation of the non-volatile state random access memory device in FIG. 2 at a reading mode.

As shown in FIG. 3B, when the supply voltage VDD powers the non-volatile state random access memory device 1 through the voltage source VS and the non-volatile state random access memory device 1 operates at the reading mode, the writing selection signal WS is at a low level of 0V (WS=0), and the word line WL also has the high level. Due to the writing selection signal WS with the low level, the PMOS transistor 100 is turned on while the NMOS transistors 204 and 205 are turned off. The node N12 has the high level of the supply voltage VDD through the turned-on PMOS transistor 100. Due to the high level of the word line WL, the NMOS transistors 208 and 209 are turned on. At this time, since to the non-volatile memory element 206 has the low resistance state, the node N20 is at a low level to turn on the PMOS transistor 200. Through the turned-on PMOS transistor 200, the node N11 is at a high level (N10="H") in response to the high level of the node N12. Moreover, since to the non-volatile memory element 207 has the high resistance state, the node N21 is at a high level to turn off the PMOS transistor 201. The NMOS transistor 203 is turned on in response to the high level of the node N11. Thus, the node N10 is at a low level (N10="L"). The NMOS transistor 202 is turned off in response to the low level of the node N10.

As described above, the node N11 is at the high level, and the node N10 is at the low level. Through the turned-on NMOS transistor 208, the bit line BL has a low level, that is the bit line BL reads the data of logic "0" from the latch circuit 11. Through the turned-on NMOS transistor 209, the bit line BLB has a high level, that is the bit line BLB reads the data of logic "1" from the latch circuit 11. Further, since the PMOS transistor 201 and the NMOS transistor 202 are turned off, the bit line BL stably reads the data of logic "0" and the bit line BLB stably reads the data of logic "1" at the reading mode. Thus, after the power supply VDD of the non-volatile state random access memory device 1 is provided, the non-volatile state random access memory device 1 is not required to operate in a conventional recall mode, thereby saving timing.

Figure 4A:
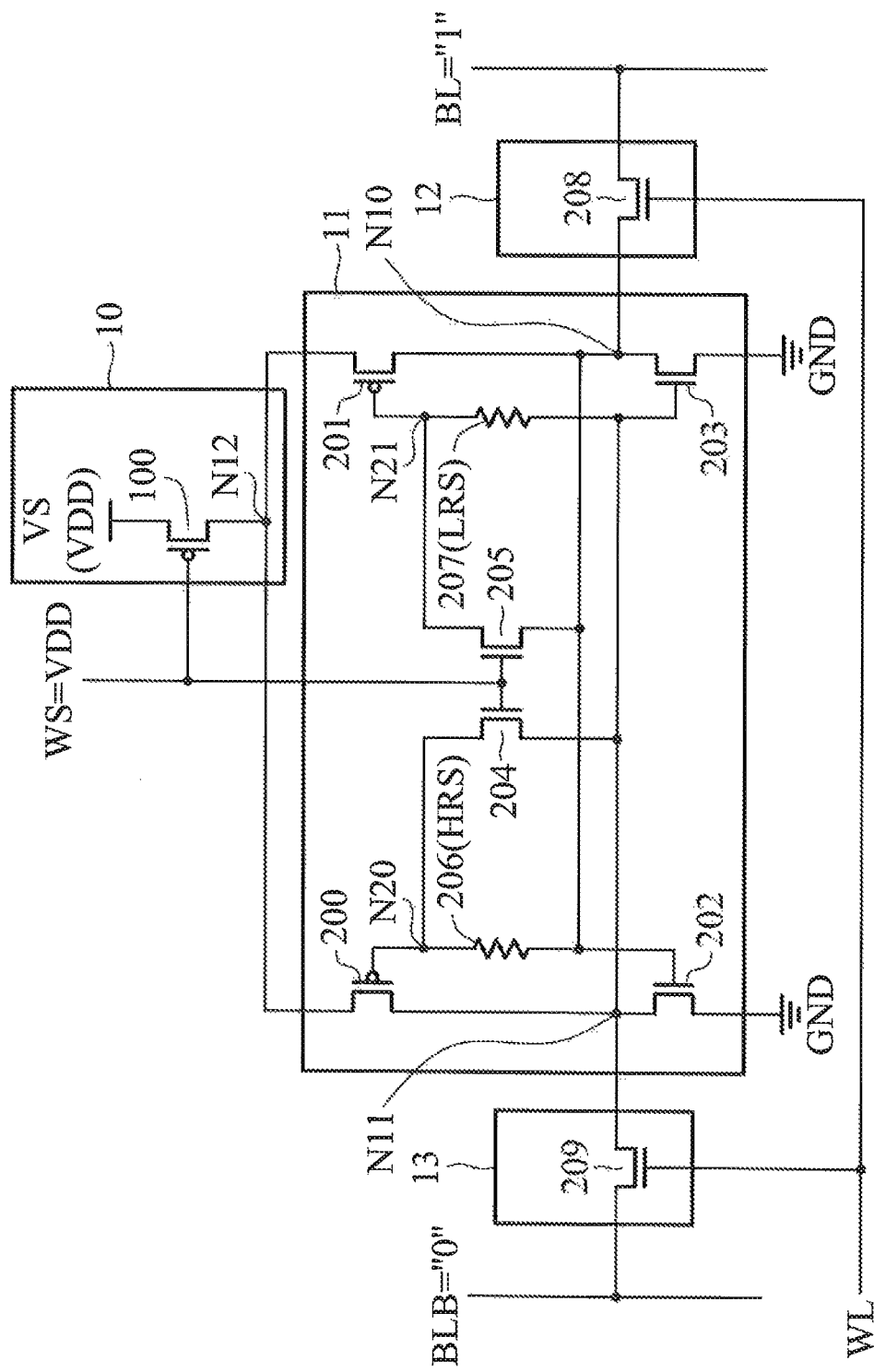
FIG. 4A shows another embodiment of the operation of the non-volatile state random access memory device in FIG. 2 at the writing mode.
Figure 4B:
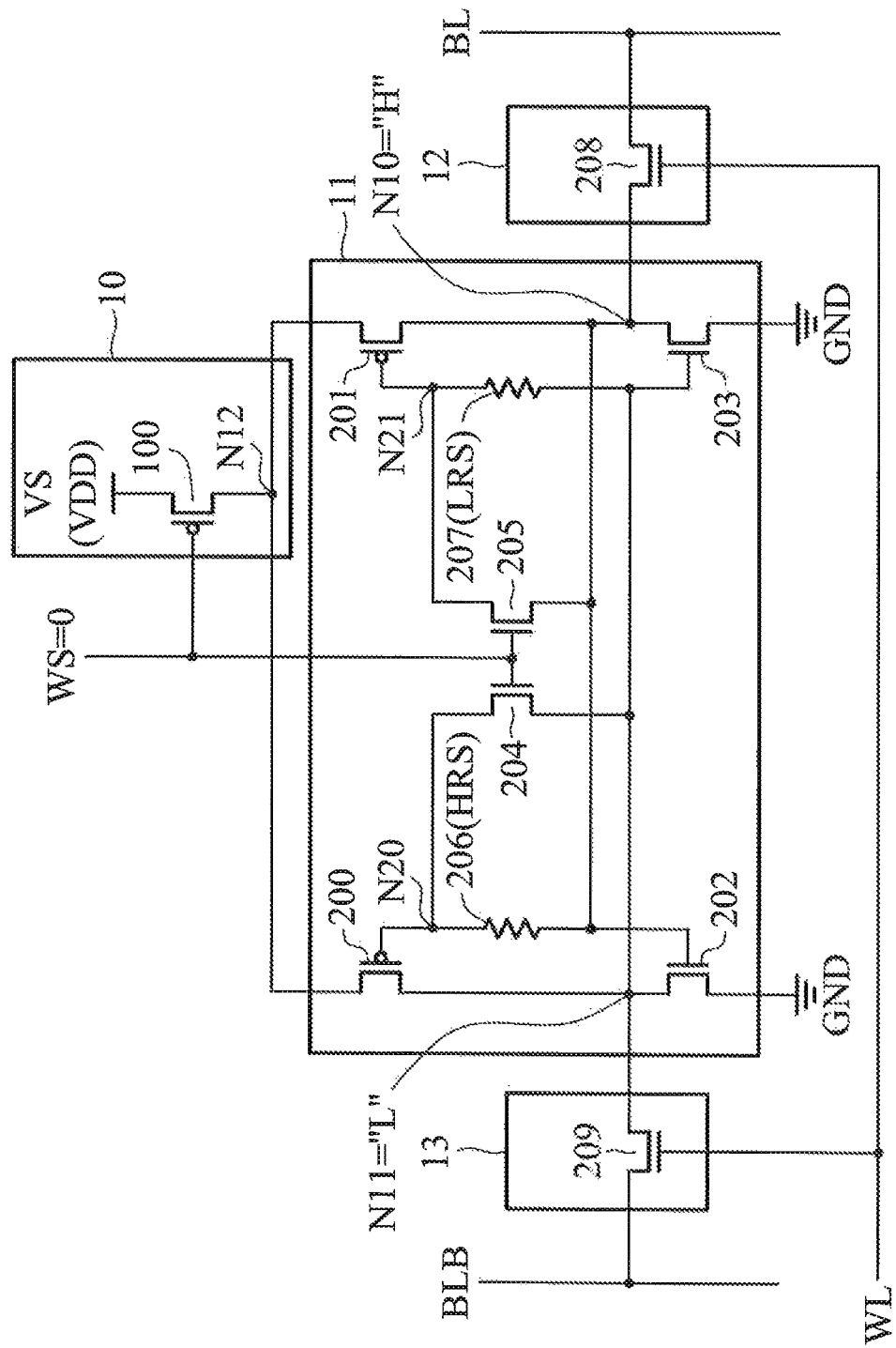
FIG. 4B shows another embodiment of the operation of the non-volatile state random access memory device in FIG. 2 at the reading mode.

FIGS. 4A and 4B show another embodiment of the operation of the non-volatile state random access memory device 1 at the writing mode and the reading mode respectively. In the embodiment, when the non-volatile state random access memory device 1 operates at the writing mode, data of logic "1" is on the bit line BL while data of logic "0" is on the bit line BLB, as shown in FIG. 4A. When the non-volatile state random access memory device 1 operates at the reading mode, the hit line BL stably reads the data of logic "1", and the bit line BLB stably reads the data of logic "0". The detailed operations of the elements of the non-volatile state random access memory device 1 in FIGS. 4A and 4B are similar to that in the embodiment of FIGS. 3A and 3B. Thus, the description related to the embodiment of FIGS. 4A and 4B is omitted here.

Figure 5:
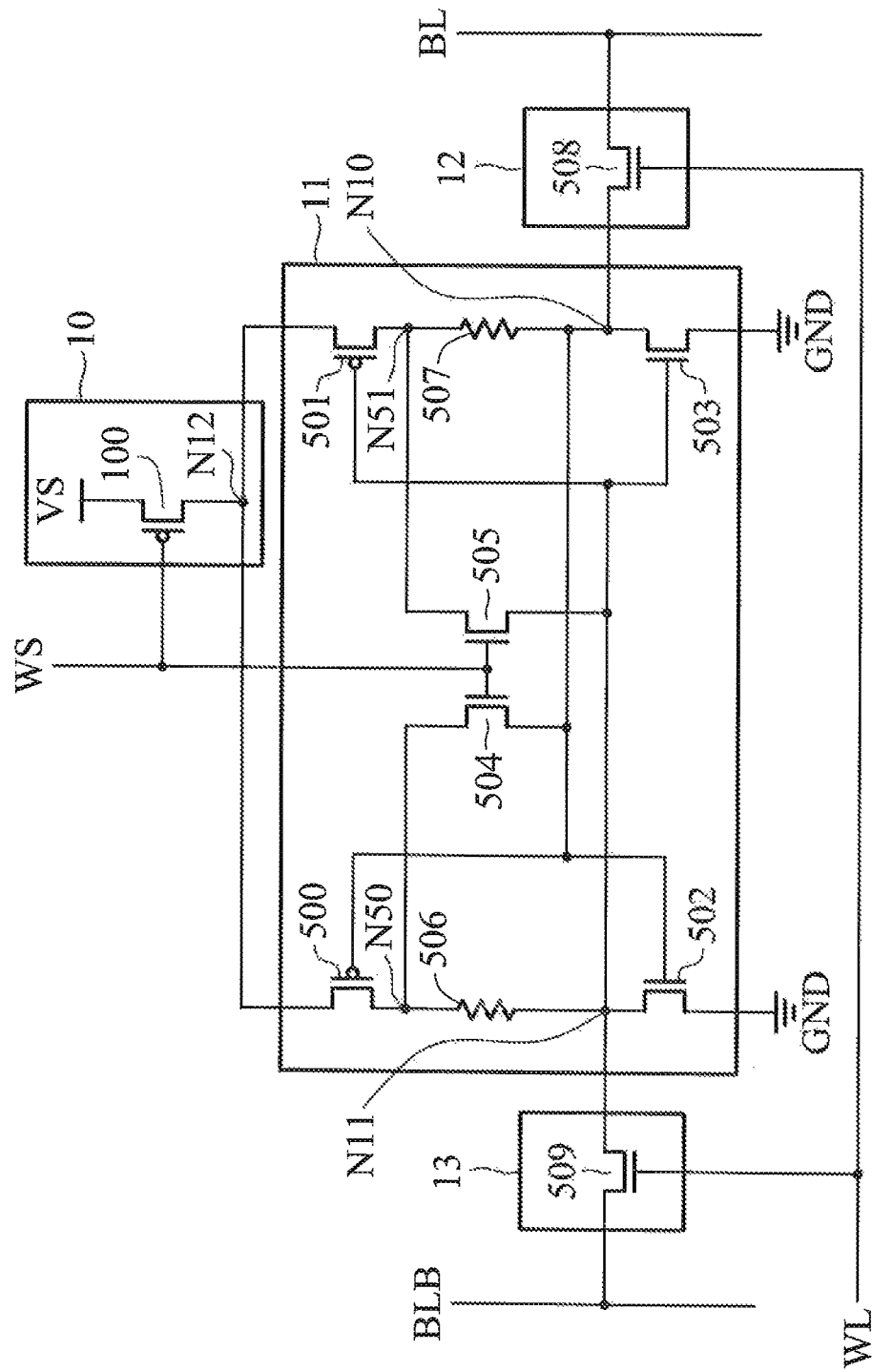
FIG. 5 shows further another exemplary embodiment of a non-volatile static random access memory circuit.

FIG. 5 shows another embodiment of the non-volatile state random access memory device 1. Referring to FIGS. 2 and 5, the different between the embodiments of FIGS. 2 and 5 is the structure of the latch circuit 11. As shown in FIG. 5, the latch circuit 11 comprises PMOS transistors 500 and 501, NMOS transistors 502-505, and non-volatile memory elements 506 and 507. In the embodiment, the switches 12 and 13 are implemented by NMOS transistors 508 and 509. A control terminal of the PMOS transistor 500 is coupled to the node N10, an input terminal thereof is coupled to the node N12, and an output terminal thereof is coupled to a node N50. A control terminal of the NMOS transistor 502 is coupled to the node N10, an input terminal thereof is coupled the node N11, and an output terminal thereof is coupled to the ground GND. A control terminal of the NMOS transistor 504 receives the writing selection signal WS, an input terminal thereof is to the node N50, and an output terminal thereof is coupled to the node N10. The non-volatile memory element 506 is coupled between the node N50 and the node N11.

A control terminal of the PMOS transistor 501 is coupled to the node N11, an input terminal thereof is coupled to the node N12, and an output terminal thereof is coupled to a node N51. A control terminal of the NMOS transistor 503 is coupled to the node N11, an input terminal thereof is coupled the node N10, and an output terminal thereof is coupled to the ground GND. A control terminal of the NMOS transistor 505 receives the writing selection signal WS, an input terminal thereof is coupled to the node N51, and an output terminal thereof is coupled to the node N11. The non-volatile memory element 507 is coupled between the node N51 and the node N10.

Figure 6A:
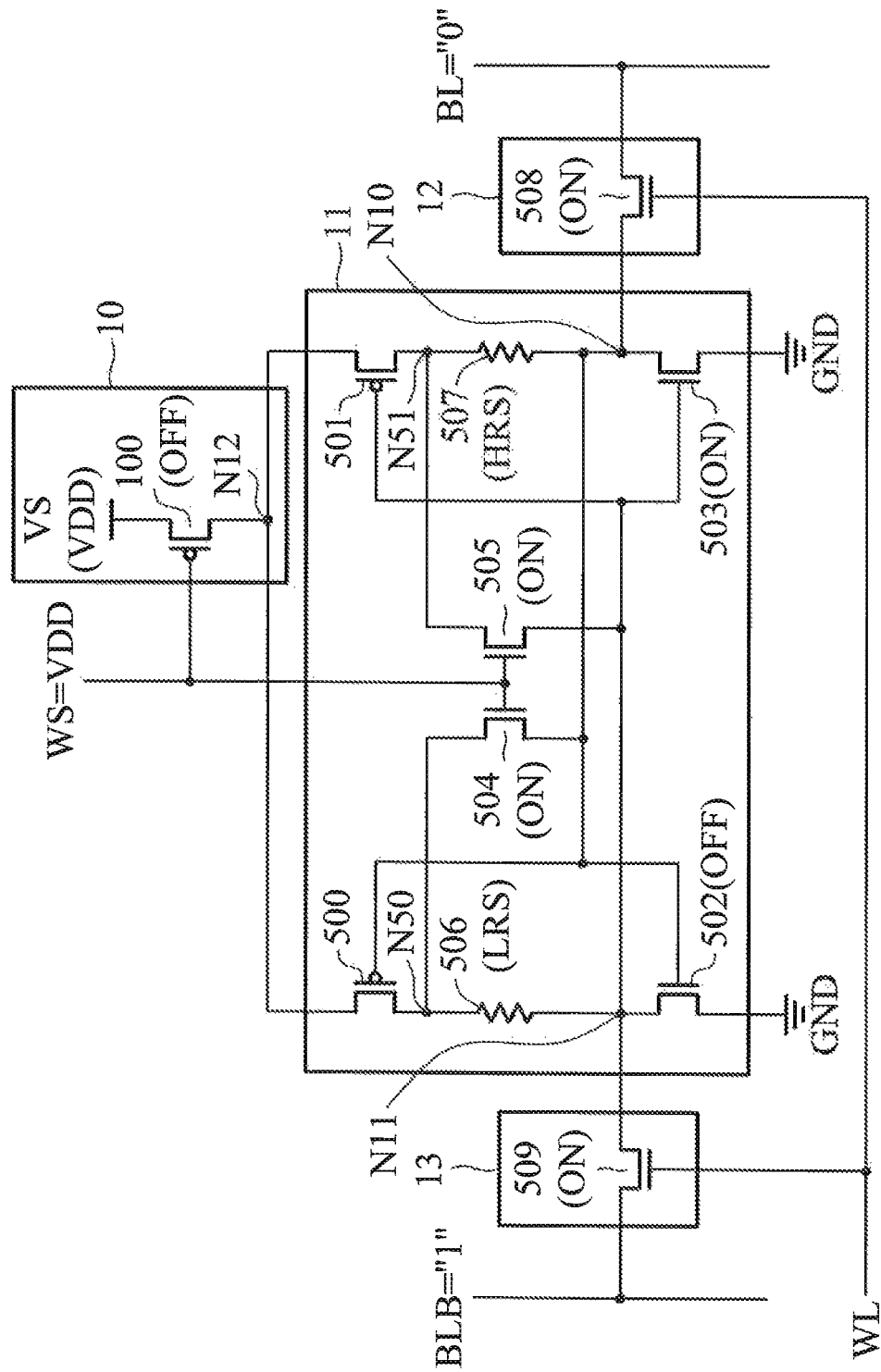
FIG. 6A shows an embodiment of the operation of the non-volatile state random access memory device in FIG. 5 at a writing mode.

As shown in FIG. 6A, when a supply voltage VDD powers the non-volatile state random access memory device 1 through the voltage source VS and the non-volatile state random access memory device 1 operates at the writing mode, the writing selection signal WS is at a high level of the supply voltage VDD (SW=VDD), and the word line WL has a high level. Assume that data of logic "0" is on the bit line BL while data of logic "1" is on the bit line BLB. Due to the writing selection signal WS with the high level, the PMOS transistor 100 is turned off (OFF) while the NMOS transistors 504 and 505 are turned on (ON). Due to the high level of the word line WL, the NMOS transistors 508 and 509 are turned on. At this time, in response to the data of logic "0" on the bit line BL, the node N10 has a low level to turn off the NMOS transistor 502. Due to the low level of the node N10 and the turned-on state of the NMOS transistor 504, the node N50 has a low level. Moreover, in response to the data of logic "1" on the bit line BLB, the node N11 has a high level to turn on the NMOS transistor 503. Due to the high level of the node N11 and the turned-on state of the NMOS transistor 505, the node N51 has a high level.

As described above, the non-volatile memory element 506 is coupled between node N50 and the node N11, and the non-volatile memory element 507 is coupled between the node N51 and the node N10. Since the node N50 has the low level and the node N11 has the high level, there is reverse bias applied to the non-volatile memory element 506, and the non-volatile memory element 506 is defined to has a low resistance state (LRS) to record the data of logic "0" on the bit line BL. On the contrary, since the node N50 has the high level and the node N10 has the low level. There is forward bias applied to the non-volatile memory element 507, and the non-volatile memory element 507 has a high resistance state (HRS) to record the data of logic "1" on the bit line BLB.

According to the embodiment, the data on the bit lines BL and BLB are recorded in the latch circuit 11 by the form of the resistance states of the non-volatile memory elements 506 and 507. Thus, before the non-volatile state random access memory device 1 enters the power-off state or the standby mode (that is the supply voltage VDD is not provided), a conventional storage mode is not required any more, thereby saving timing of the non-volatile state random access memory device 1.

Figure 6B:
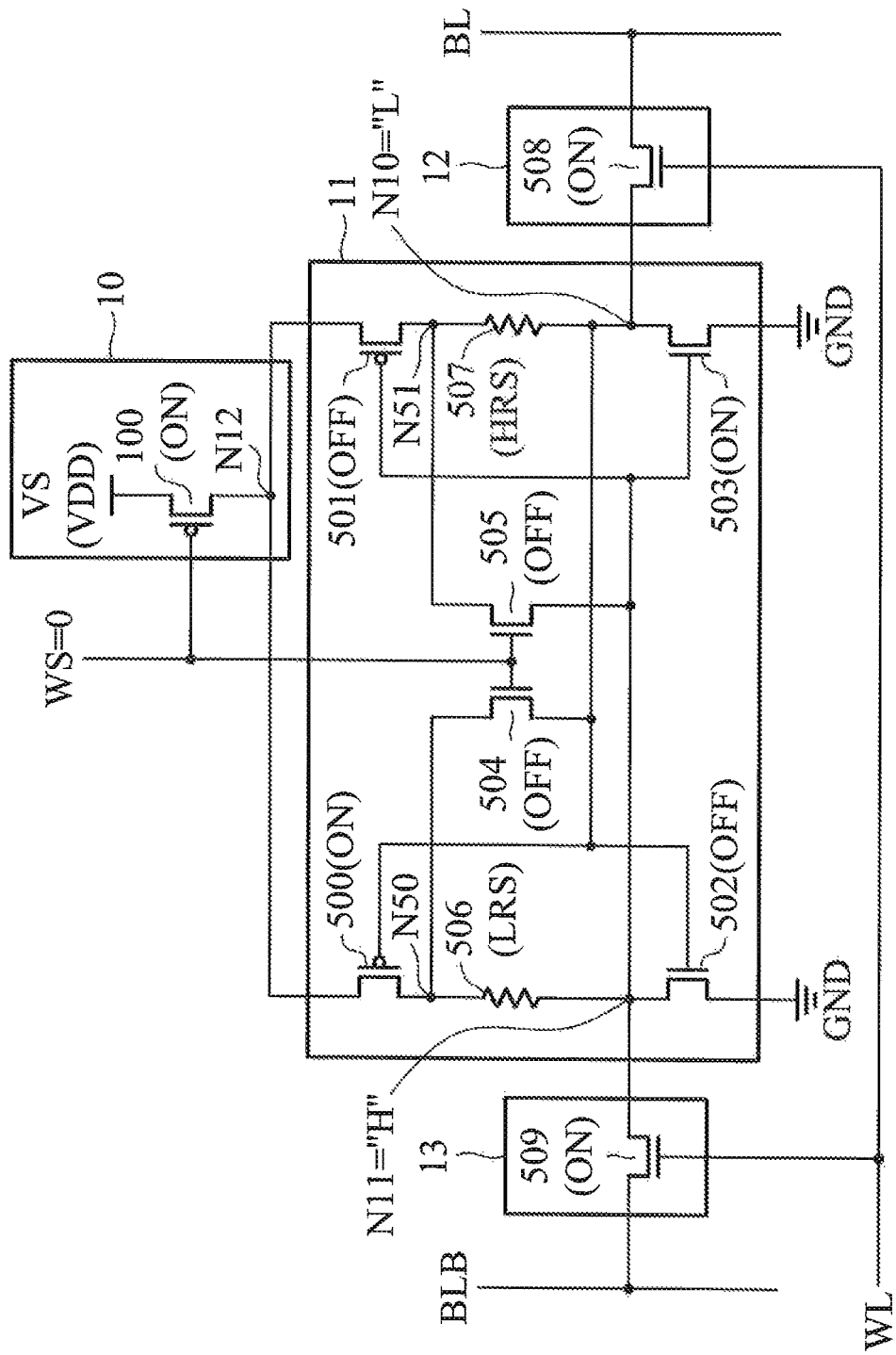
FIG. 6B shows an embodiment of the operation of the non-volatile state random access memory device in FIG. 5 at a reading mode.

As shown in FIG. 6B, when the supply voltage VDD powers the non-volatile state random access memory device 1 through the voltage source VS and the non-volatile state random access memory device 1 operates at the reading mode, the writing selection signal WS is at a low level of 0V (WS=0), and the word line WL also has the high level. Due to the writing selection signal WS with the low level, the PMOS transistor 100 is turned on while the NMOS transistors 504 and 505 are turned off. The node N12 has the high level of the supply voltage VDD through the turned-on PMOS transistor 100. Due to the high level of the word line WL, the NMOS transistors 508 and 509 are turned on. At this time, since to the non-volatile memory element 507 has the high resistance state, the current passing through the non-volatile memory element 507 is less, and the node N10 is at a low level (N10="L") to turn on the PMOS transistor 500 and turn off the NMOS 502. Moreover, since to the non-volatile memory element 506 has the low resistance state, the current passing through the non-volatile memory element 506 is large, and the node N11 is at a high level (N11="H") to turn off the PMOS transistor 501 and turn on the NMOS transistor 503.

As described above, the node N11 is at the high level, and the node N10 is at the low level. Through the turned-on switch 12, the bit line BL has a low level, that is the bit line BL reads the data of logic "0" from the latch circuit 11. Through the turned-on switch 13, the bit line BLB has a high level, that is the bit line BLB reads the data of logic "1" from the latch circuit 11. Further, since the PMOS transistor 501 and the NMOS transistor 502 are turned off, the bit line BL stably reads the data of logic "0" and the bit line BLB stably reads the data of logic "1" at the reading mode.

Figure 7A:
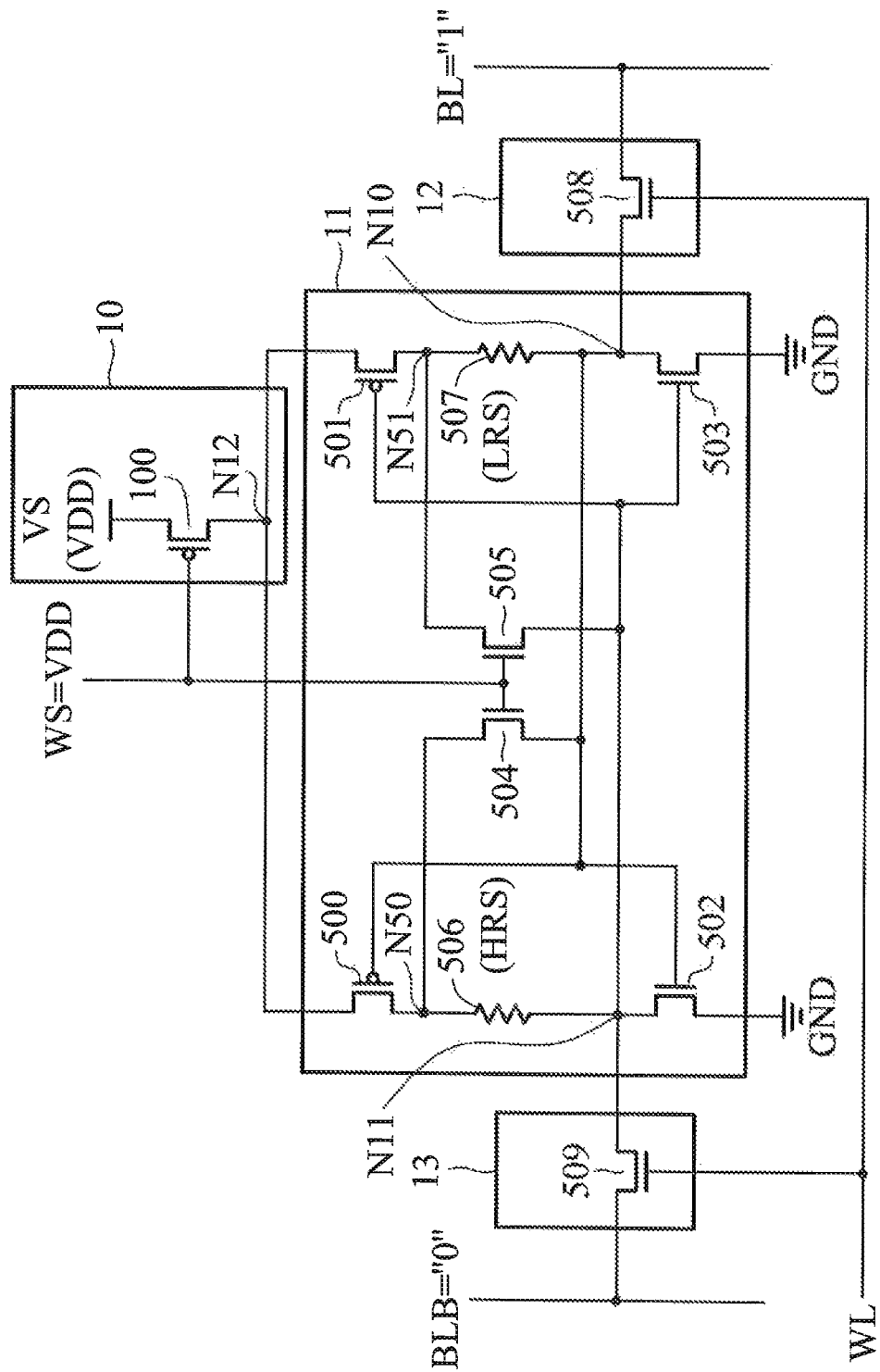
FIG. 7A shows another embodiment of the operation of the non-volatile state random access memory device in FIG. 5 at the writing mode.
Figure 7B:
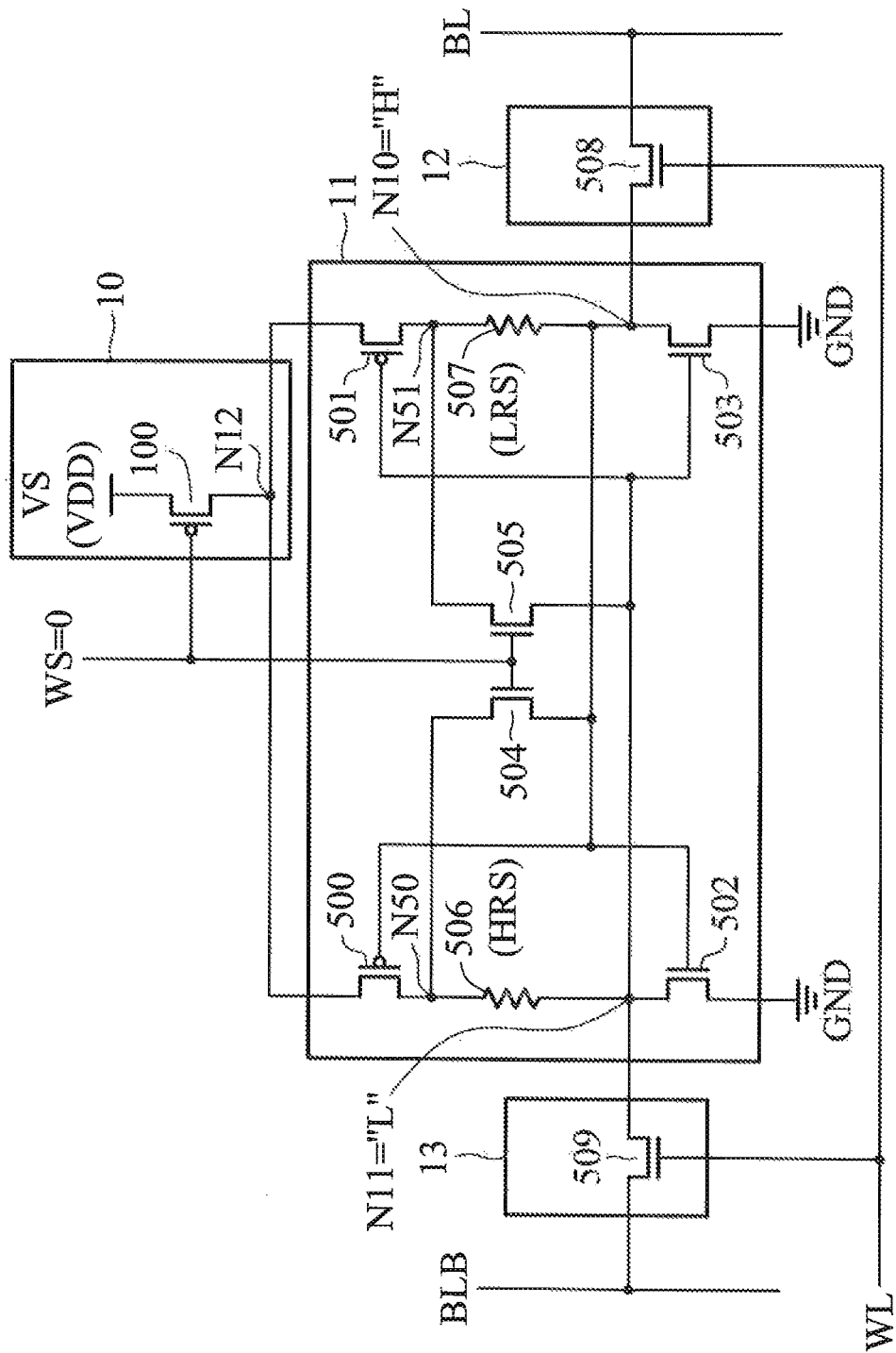
FIG. 7B shows another embodiment of the operation of the non-volatile state random access memory device in FIG. 5 at the reading mode.

FIGS. 7A and 7B show another embodiment of the operation of the non-volatile state random access memory device 1 at the writing mode and the reading mode respectively. In the embodiment, when the non-volatile state random access memory device 1 operates at the writing mode, data of logic "1" is on the bit line BL while data of logic "0" is on the hit line BLB, as shown in FIG. 7A. When the non-volatile state random access memory device 1 operates at the reading mode, the bit line BL stably reads the data of logic "1", and the bit line BLB stably reads the data of logic "0", as shown in FIG. 7B. The detailed operations of the elements of the non-volatile state random access memory device 1 in FIGS. 7A and 7B are similar to that in the embodiment of FIGS. 6A and 6B. Thus, the description related to the embodiment of FIGS. 7A and 7B is omitted here.

Figure 8:
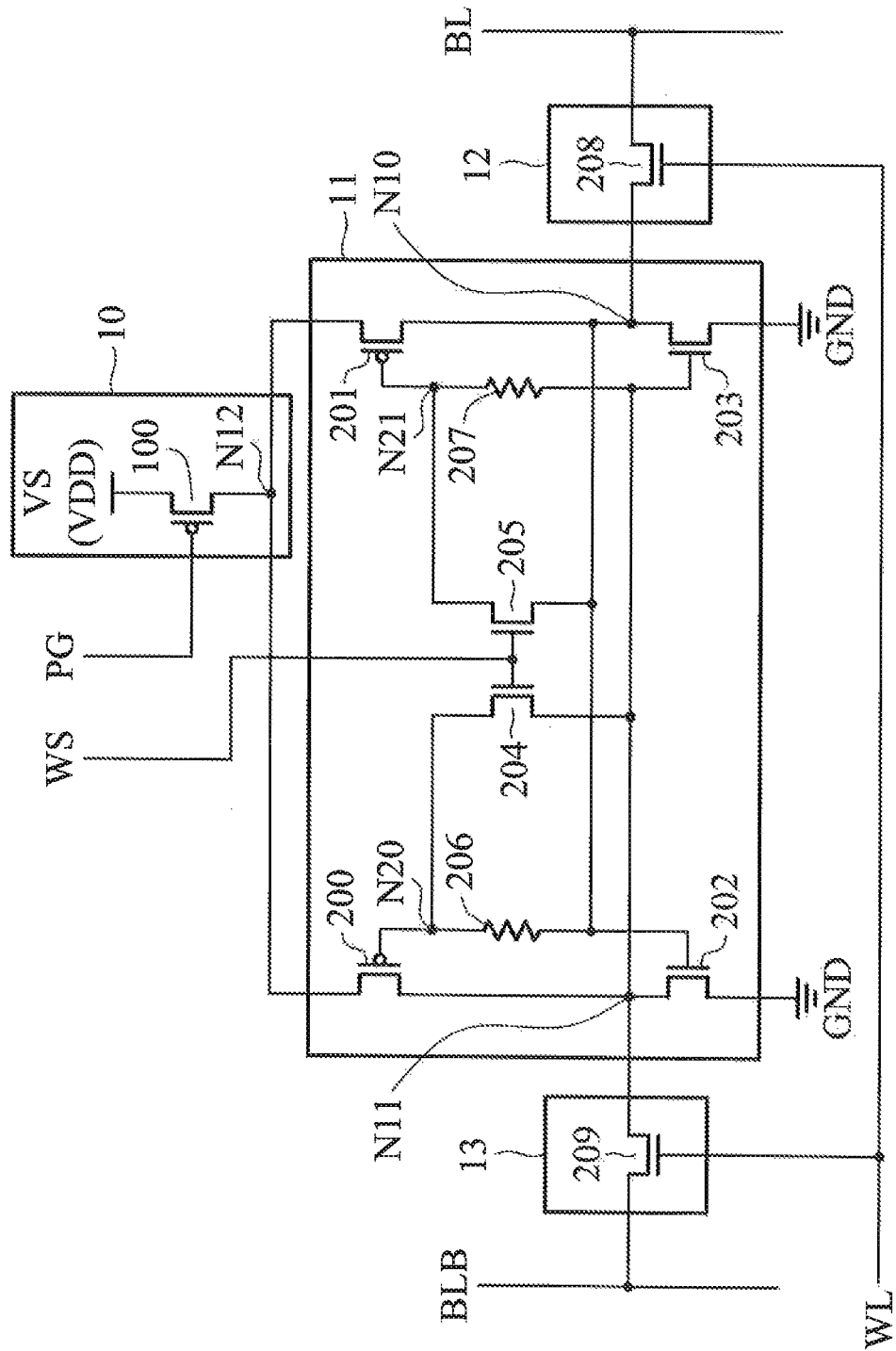
FIG. 8 shows an exemplary embodiment of a non-volatile static random access memory circuit.

FIG. 8 shows another embodiment of the non-volatile state random access memory device 1. The different between the embodiments of FIG. 2 and FIG. 8 is the structure of the writing control circuit 10. In the writing control circuit 10, the control terminal of the PMOS transistor receives a power gating signal PG instead of the writing signal WS. When the non-volatile state random access memory device 1 is at the standby mode and operates at the writing mode, the power gating signal PG has a high level to turn off the PMOS transistor 100. When the non-volatile state random access memory device 1 operates at the reading mode, the power gating signal PG has a low level to turn on the PMOS transistor 100. The operations of the other elements of the non-volatile state random access memory device 1 in the embodiment FIG. 8 are the same as that in the embodiment of FIGS. 2, 3A, 3B, 4A, and 4B, omitting the related description here. In the embodiment, the writing selection signal WS has a low level at the standby mode.

Figure 9:
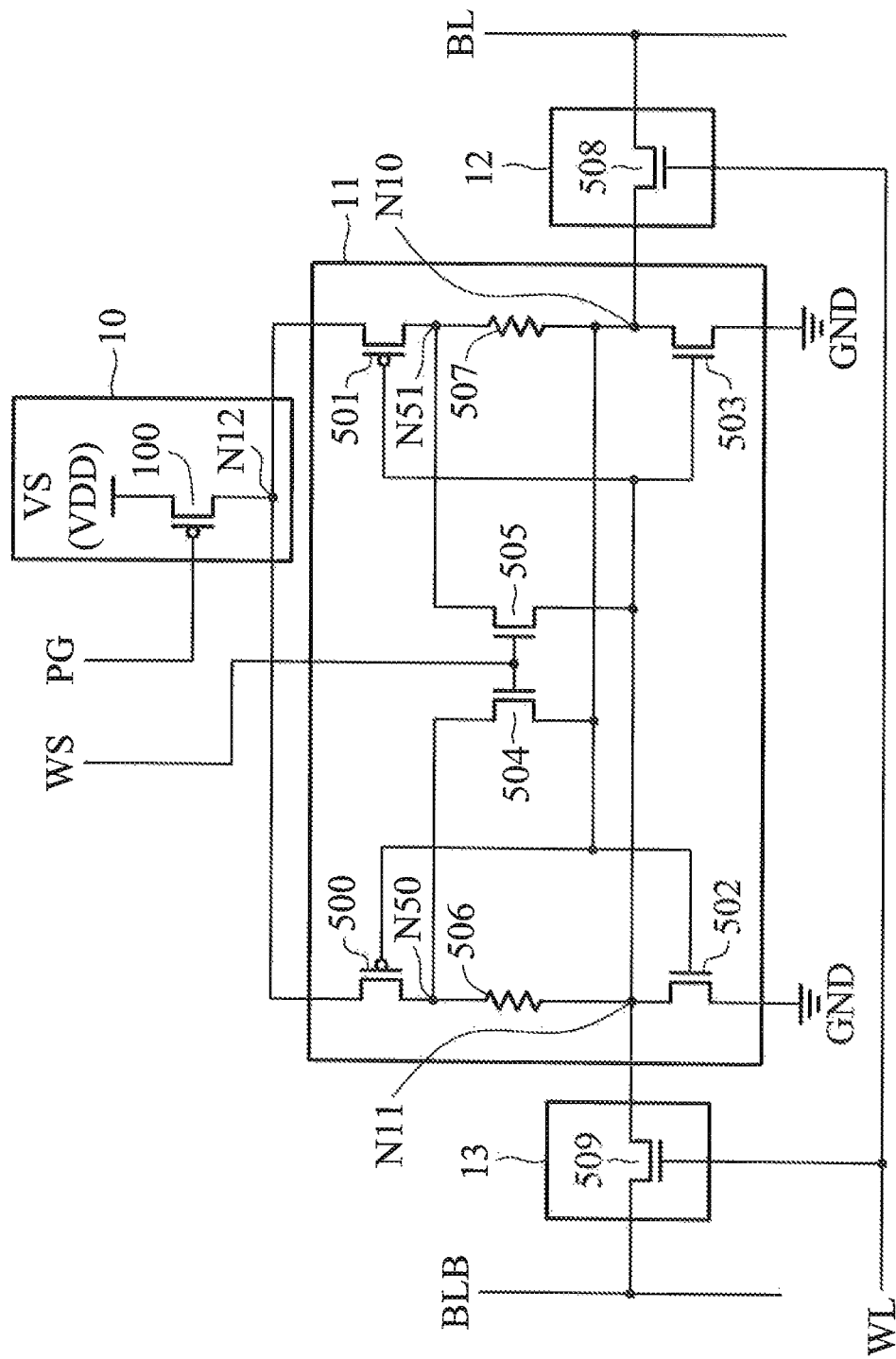
FIG. 9 shows another exemplary embodiment of a non-volatile static random access memory circuit.

FIG. 9 shows another embodiment of the non-volatile state random access memory device 1. The different between the embodiments of FIG. 9 and FIG. 5 is the structure of the writing control circuit 10. In the writing control circuit 10, the control terminal of the PMOS transistor receives a power gating signal PG instead of the writing selection signal WS. When the non-volatile state random access memory device 1 is at the standby mode and operates at the writing mode, the power gating signal PG has a high level to turn off the PMOS transistor 100. When the non-volatile state random access memory device 1 operates at the reading mode, the power gating signal PG has a low level to turn on the PMOS transistor 100. The operations of the other elements of the non-volatile state random access memory device 1 in the embodiment FIG. 9 are the same as that in the embodiment of FIGS. 5, 6A, 6B, 7A, and 7B, omitting the related description here. In the embodiment, the writing selection signal WS has a low level at the standby mode.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass such modifications and similar arrangements.

What is claimed is:

1. A non-volatile static random access memory (nvSRAM) circuit comprising:
a first switch having a first terminal coupled to a first bit line and further having a second terminal;
a second switch having a first terminal coupled to a second bit line and further having a second terminal;
a latch circuit, coupled to the second terminal of the first switch and the second terminal of the second switch, having a first non-volatile memory element,
wherein when the non-volatile static random access memory circuit is at a writing mode, first input data on the first bit line is written into the latch circuit, and the first non-volatile memory element has a first state corresponding to the first input data, and
wherein when the non-volatile static random access memory is at a reading mode, first readout data is generated according to the first state of the first non-volatile memory element is generated and provided to the first bit line, and
wherein after power supply of the non-volatile static random access memory circuit is switched to on from off, the non-volatile static random access memory circuit does not operate a recall operation.

2. The non-volatile static random access memory circuit as claimed in claim 1, wherein at the writing mode, the first switch and the second switch are turned on.

3. The non-volatile static random access memory circuit as claimed in claim 1, wherein at the reading mode, the first switch and the second switch are turned on.

4. The non-volatile static random access memory circuit as claimed in claim 1, wherein between the writing mode and the reading mode, no supply voltage powers the non-volatile static random access memory circuit or the non-volatile static random access memory circuit is at a standby mode.

5. The non-volatile static random access memory circuit as claimed in claim 1 further comprising:
a writing control circuit coupled to the latch circuit and receiving a writing selection signal to control the latch circuit,
wherein at the writing mode, the writing selection signal is at a first voltage level to control the latch circuit to change the first non-volatile memory element to be in the first state, and
wherein at the reading mode, the writing selection signal is at a second voltage level to control the latch circuit to generate the first readout signal according to the first state.

6. The non-volatile static random access memory circuit as claimed in claim 1, wherein the latch circuit comprises:
a first first-type transistor having a control terminal coupled to a first node, an input terminal, and an output terminal coupled to a second node;
a first second-type transistor having a control terminal coupled to a third node, an input terminal coupled to the second node, and an output terminal coupled to a ground;
a second second-type transistor having a control terminal, an input terminal coupled to the first node, and an output terminal coupled to the second node;
a second first-type transistor having a control terminal coupled to a fourth node, an input terminal, and an output terminal coupled to the third node;
a third second-type transistor having a control terminal coupled to the second node, an input terminal coupled to the third node, and an output terminal coupled to the ground;
a fourth second-type transistor having a control terminal, an input terminal coupled to the fourth node, and an output terminal coupled to the third node,
wherein the first non-volatile memory element is coupled between the second node and the fourth node, and
wherein the second terminal of the first switch is coupled to the second node, and the second terminal of the second switch is coupled to the third node.

7. The non-volatile static random access memory circuit as claimed in claim 6, wherein at the writing mode, the second second-type transistor and the fourth second-type transistor are turned on.

8. The non-volatile static random access memory circuit as claimed in claim 6, wherein at the reading mode, the second second-type transistor and the fourth second-type transistor are turned off, and the input terminal of the first first-type transistor and the input terminal of the second first-type transistor receive a supply voltage of the non-volatile static random access memory circuit.

9. The non-volatile static random access memory circuit as claimed in claim 6 further comprising:
a third first-type transistor having a control terminal, an input terminal coupled to a voltage source of the non-volatile static random access memory circuit, and an output terminal coupled to the input terminal of the first first-type transistor and the input terminal of the second first-type transistor,
wherein the control terminal of the second second-type transistor and the control terminal of the fourth second-type transistor receive the writing selection signal,
wherein at the writing mode, the third first-type transistor is turned off, and the writing selection signal is at a first voltage level to turn on the second second-type transistor and the fourth second-type transistor, and
wherein at the reading mode, the third first-type transistor is turned on, and the writing selection signal is at a second voltage level to turn off the second second-type transistor and the fourth second-type transistor.

10. The non-volatile static random access memory circuit as claimed in claim 9,
wherein the control terminal of the third first-type transistor receives the writing selection signal,
wherein at the writing mode, the writing selection signal is at the first voltage level to turn off the third first-type transistor, and
wherein at the reading mode, the writing selection signal is at the second voltage level to turn on the third first-type transistor.

11. The non-volatile static random access memory circuit as claimed in claim 9,
wherein the control terminal of the third first-type transistor receives a power gating signal,
wherein at the writing mode, the power gating signal is at a third voltage level to turn off the third first-type transistor, and
wherein at the reading mode, the power gating signal is at a fourth voltage level to turn on the third first-type transistor.

12. The non-volatile static random access memory circuit as claimed in claim 11, wherein when the non-volatile static random access memory circuit is at a standby mode, the power gating signal is at the third voltage level to turn off the third first-type transistor.

13. The non-volatile static random access memory circuit as claimed in claim 1, wherein the latch circuit comprises:
a first first-type transistor having a control terminal coupled to a first node, an input terminal, and an output terminal coupled to a second node;
a first second-type transistor having a control terminal coupled to the first node, an input terminal coupled to a third node, and an output terminal coupled to a ground;
a second second-type transistor having a control terminal, an input terminal coupled to the second node, and an output terminal coupled to the first node;
a second first-type transistor having a control terminal coupled to the third node, an input terminal, and an output terminal coupled to a fourth node;
a third second-type transistor having a control terminal coupled to the third node, an input terminal coupled to the first node, and an output terminal coupled to the ground; and
a fourth second-type transistor having a control terminal, an input terminal coupled to the fourth node, and an output terminal coupled to the third node,
wherein the first non-volatile memory element is coupled between the first node and the fourth node, and
wherein the second terminal of the first switch is coupled to the third node, and the second terminal of the second switch is coupled to the first node.

14. The non-volatile static random access memory circuit as claimed in claim 13, wherein at the writing mode, the second second-type transistor and the fourth second-type transistor are turned on.

15. The non-volatile static random access memory circuit as claimed in claim 13, wherein at the reading mode, the second second-type transistor and the fourth second-type transistor are turned off, and the input terminal of the first first-type transistor and the input terminal of the second first-type transistor receive a supply voltage of the non-volatile static random access memory circuit.

16. The non-volatile static random access memory circuit as claimed in claim 13 further comprising:
a third first-type transistor having a control terminal, an input terminal coupled to a voltage source of the non-volatile static random access memory circuit, and an output terminal coupled to the input terminal of the first first-type transistor and the input terminal of the second first-type transistor,
wherein the control terminal of the second second-type transistor and the control terminal of the fourth second-type transistor receive the writing selection signal,
wherein at the writing mode, the third first-type transistor is turned off, and the writing selection signal is at a first voltage level (VDD) to turn on the second second-type transistor and the fourth second-type transistor, and
wherein at the reading mode, the third first-type transistor is turned on, and the writing selection signal is at a second voltage level to turn off the second second-type transistor and the fourth second-type transistor.

17. The non-volatile static random access memory circuit as claimed in claim 16,
wherein the control terminal of the third first-type transistor receives the writing selection signal,
wherein at the writing mode, the writing selection signal is at the first voltage level to turn off the third first-type transistor, and
wherein at the reading mode, the writing selection signal is at a second voltage level to turn on the third first-type transistor.

18. The non-volatile static random access memory circuit as claimed in claim 16,
wherein the control terminal of the third first-type transistor receives a power gating signal,
wherein at the writing mode, the power gating signal is at a third voltage level to turn off the third first-type transistor, and
wherein at the reading mode, the power gating signal is at a fourth voltage to turn on the third first-type transistor.

19. The non-volatile static random access memory circuit as claimed in claim 18, wherein the non-volatile static random access memory circuit is at a standby mode, the power gating signal is at the third voltage level to turn off the third first-type transistor.

20. The non-volatile static random access memory circuit as claimed in claim 1,
wherein the latch circuit further has a second non-volatile memory element, wherein when the non-volatile static random access memory circuit is at the writing mode, second input data on the second bit line is written into the latch circuit, and the second non-volatile memory element has a second state corresponding to the second input data, and wherein the non-volatile static random access memory is at the reading mode, second readout data is generated according to the second state of the second non-volatile memory element is generated and provided to the second bit line.

* * * * *